(12) United States Patent
Broughton et al.

(10) Patent No.: US 9,814,101 B2
(45) Date of Patent: *Nov. 7, 2017

(54) HEATED RIGID ELECTRICAL HARNESS FOR A GAS TURBINE ENGINE

(71) Applicant: ROLLS-ROYCE PLC, London (GB)

(72) Inventors: Paul Broughton, Leicester (GB); Michael Christopher Willmot, Sheffield (GB); Justin Sean Dalton, Derby (GB)

(73) Assignee: ROLLS-ROYCE plc, London (GB)

( * ) Notice: Subject to any disclaimer, the term of this patent is extended or adjusted under 35 U.S.C. 154(b) by 321 days.

This patent is subject to a terminal disclaimer.

(21) Appl. No.: 14/100,745

(22) Filed: Dec. 9, 2013

(65) Prior Publication Data

US 2014/0165531 A1    Jun. 19, 2014

(30) Foreign Application Priority Data

Dec. 17, 2012 (EP) .................................... 12197402
May 3, 2013 (GB) .................................... 1308033.8

(51) Int. Cl.
*F02C 7/12* (2006.01)
*F02C 7/20* (2006.01)
(Continued)

(52) U.S. Cl.
CPC ............ *H05B 3/28* (2013.01); *B23P 6/005* (2013.01); *B60R 16/00* (2013.01); *B60R 16/02* (2013.01);
(Continued)

(58) Field of Classification Search
CPC   F02C 7/224; F02C 7/047; H02G 3/04; B64D 2033/0233; B64D 15/12; H01B 7/06; H01B 11/02
(Continued)

(56) References Cited

U.S. PATENT DOCUMENTS 2,448,757 A * 9/1948 Alban .................... H01C 17/06
                                                        420/434
2,523,083 A    9/1950 Witkowski
(Continued)

FOREIGN PATENT DOCUMENTS

DE       2941950 B1    2/1981
DE   102009047334 A1   6/2011
(Continued)

OTHER PUBLICATIONS

Apr. 6, 2015 Office Action issued in U.S. Appl. No. 13/716,648.
(Continued)

*Primary Examiner* — Steven Sutherland
*Assistant Examiner* — Eric Linderman
(74) *Attorney, Agent, or Firm* — Oliff PLC

(57) ABSTRACT

A rigid electrical raft has electrical conductors embedded in a rigid material. The electrical conductors transmit electrical signals through the rigid electrical raft, which may form part of an electrical system of a gas turbine engine. The rigid electrical raft also has electrical heating elements embedded therein. The electrical heating elements provide heat which may be used, for example, to prevent condensation and/or ice build-up and/or to raise the temperature of electrical components to be within a desired range.

11 Claims, 7 Drawing Sheets

(51) Int. Cl.

| | | |
|---|---|---|
| F02C 7/32 | (2006.01) | |
| H05B 3/28 | (2006.01) | |
| B23P 6/00 | (2006.01) | |
| H02G 3/04 | (2006.01) | |
| H01R 12/00 | (2006.01) | |
| H02G 3/32 | (2006.01) | |
| B60R 16/02 | (2006.01) | |
| B64C 3/34 | (2006.01) | |
| F02C 7/141 | (2006.01) | |
| B60R 16/08 | (2006.01) | |
| F02C 7/16 | (2006.01) | |
| H01R 12/57 | (2011.01) | |
| H01R 12/59 | (2011.01) | |
| H01R 12/51 | (2011.01) | |
| H01R 12/61 | (2011.01) | |
| H02G 3/00 | (2006.01) | |
| B60R 16/00 | (2006.01) | |
| B64D 29/08 | (2006.01) | |
| F02C 7/00 | (2006.01) | |
| H02G 1/00 | (2006.01) | |
| H02G 3/02 | (2006.01) | |
| F02C 7/047 | (2006.01) | |
| F02C 7/224 | (2006.01) | |
| F24H 1/10 | (2006.01) | |
| H05B 1/02 | (2006.01) | |
| H05K 7/20 | (2006.01) | |

(52) U.S. Cl.
CPC ...... *B60R 16/0207* (2013.01); *B60R 16/0215* (2013.01); *B60R 16/08* (2013.01); *B64C 3/34* (2013.01); *B64D 29/08* (2013.01); *F02C 7/00* (2013.01); *F02C 7/047* (2013.01); *F02C 7/12* (2013.01); *F02C 7/141* (2013.01); *F02C 7/16* (2013.01); *F02C 7/20* (2013.01); *F02C 7/224* (2013.01); *F02C 7/32* (2013.01); *F24H 1/105* (2013.01); *H01R 12/00* (2013.01); *H01R 12/51* (2013.01); *H01R 12/515* (2013.01); *H01R 12/57* (2013.01); *H01R 12/59* (2013.01); *H01R 12/592* (2013.01); *H01R 12/61* (2013.01); *H02G 1/00* (2013.01); *H02G 3/00* (2013.01); *H02G 3/02* (2013.01); *H02G 3/04* (2013.01); *H02G 3/32* (2013.01); *H05B 1/0236* (2013.01); *H05K 7/20* (2013.01); *F05D 2260/30* (2013.01); *Y02T 50/672* (2013.01); *Y10T 29/49002* (2015.01); *Y10T 29/49117* (2015.01); *Y10T 29/49234* (2015.01); *Y10T 29/49236* (2015.01); *Y10T 29/49238* (2015.01); *Y10T 156/10* (2015.01)

(58) Field of Classification Search
USPC .......................................... 244/134 D, 134 R
See application file for complete search history.

(56) References Cited

U.S. PATENT DOCUMENTS

| | | | |
|---|---|---|---|
| 2,523,504 A | 9/1950 | Ford, Jr. | |
| 2,866,522 A | 12/1958 | Morley | |
| 2,877,544 A | 3/1959 | Gammel | |
| 2,963,538 A * | 12/1960 | Dahlgren | H01B 7/08 156/309.6 |
| 3,086,071 A * | 4/1963 | Preston | H01B 7/08 156/333 |
| 3,128,214 A * | 4/1964 | Lay | H01B 7/0045 156/56 |
| 3,168,617 A * | 2/1965 | Richter | H01B 7/0838 156/47 |
| 3,284,003 A | 11/1966 | Ciemochowski | |
| 3,494,657 A | 2/1970 | Harper et al. | |
| 3,612,744 A | 10/1971 | Thomas | |
| 3,700,825 A | 10/1972 | Taplin et al. | |
| 3,710,568 A | 1/1973 | Rice | |
| 4,137,888 A | 2/1979 | Allan | |
| 4,149,567 A | 4/1979 | Weirich | |
| 4,180,608 A * | 12/1979 | Del | H05K 3/4673 156/235 |
| 4,220,912 A | 9/1980 | Williams | |
| 4,488,970 A | 12/1984 | Clark | |
| 4,533,787 A | 8/1985 | Anderegg et al. | |
| 4,652,064 A | 3/1987 | Cetrone | |
| 4,671,593 A | 6/1987 | Millon-Fremillon et al. | |
| 4,846,405 A | 7/1989 | Zimmermann | |
| 5,004,639 A | 4/1991 | Desai | |
| 5,012,639 A * | 5/1991 | Ream | B64D 29/00 60/226.1 |
| 5,031,396 A | 7/1991 | Margnelli | |
| 5,048,747 A * | 9/1991 | Clark | H05K 3/3484 228/180.21 |
| 5,091,605 A | 2/1992 | Clifford | |
| 5,097,390 A | 3/1992 | Gerrie et al. | |
| 5,138,784 A | 8/1992 | Niwa | |
| 5,142,448 A | 8/1992 | Kober et al. | |
| 5,174,110 A * | 12/1992 | Duesler | F02C 7/32 138/111 |
| 5,249,417 A | 10/1993 | Duesler et al. | |
| 5,435,124 A | 7/1995 | Sadil et al. | |
| 5,509,599 A * | 4/1996 | Laue | H05K 1/141 228/180.21 |
| 5,688,145 A | 11/1997 | Liu | |
| 5,691,509 A | 11/1997 | Balzano | |
| 5,692,909 A | 12/1997 | Gadzinski | |
| 5,795,172 A | 8/1998 | Shahriari et al. | |
| 5,870,824 A | 2/1999 | Lilja et al. | |
| 5,876,013 A | 3/1999 | Ott | |
| 5,885,111 A | 3/1999 | Yu | |
| 5,895,889 A | 4/1999 | Uchida et al. | |
| 6,050,853 A | 4/2000 | Ando et al. | |
| 6,148,500 A * | 11/2000 | Krone | H01F 17/0033 29/602.1 |
| 6,157,542 A | 12/2000 | Wu | |
| 6,328,010 B1 | 12/2001 | Thurman | |
| 6,344,616 B1 * | 2/2002 | Yokokawa | H01B 7/00 174/117 F |
| 6,399,889 B1 | 6/2002 | Korkowski et al. | |
| 6,434,473 B1 | 8/2002 | Hattori | |
| 6,481,101 B2 | 11/2002 | Reichinger | |
| 6,588,820 B2 | 7/2003 | Rice | |
| 6,689,446 B2 | 2/2004 | Barnes et al. | |
| 6,702,607 B2 | 3/2004 | Kondo | |
| 6,849,805 B2 * | 2/2005 | Honda | H05K 3/3447 174/250 |
| 6,969,807 B1 * | 11/2005 | Lin | H01B 7/0861 174/117 F |
| 6,971,650 B2 | 12/2005 | Marelja | |
| 6,971,841 B2 | 12/2005 | Care | |
| 7,002,269 B2 | 2/2006 | Angerpointer | |
| 7,010,906 B2 | 3/2006 | Cazenave et al. | |
| 7,232,315 B2 | 6/2007 | Uchida et al. | |
| 7,281,318 B2 | 10/2007 | Marshall et al. | |
| 7,316,390 B2 | 1/2008 | Burlison | |
| 7,389,977 B1 | 6/2008 | Fernandez et al. | |
| 7,414,189 B2 | 8/2008 | Griess | |
| 7,500,644 B2 | 3/2009 | Naudet et al. | |
| 7,506,499 B2 | 3/2009 | Fert et al. | |
| 7,516,621 B2 | 4/2009 | Suttie et al. | |
| 7,525,816 B2 | 4/2009 | Sawachi | |
| 7,543,442 B2 * | 6/2009 | Derenes | F01D 9/065 60/226.1 |
| 7,592,546 B2 | 9/2009 | Johansson | |
| 7,661,272 B2 * | 2/2010 | Gagneux | F01D 9/065 60/796 |
| 7,719,378 B2 | 5/2010 | Blair et al. | |
| 7,745,730 B2 * | 6/2010 | Bailey | H01B 7/0838 174/117 F |
| 7,762,502 B2 | 7/2010 | Mesing et al. | |

(56) References Cited

U.S. PATENT DOCUMENTS

| | | | |
|---|---|---|---|
| 7,837,497 B1 | 11/2010 | Matsuo et al. | |
| 7,862,348 B2 | 1/2011 | Strauss | |
| 8,038,104 B1 | 10/2011 | Larkin | |
| 8,137,524 B2 | 3/2012 | Berggren et al. | |
| 8,317,524 B2 | 11/2012 | Bailey | |
| 8,491,013 B2 | 7/2013 | Peer et al. | |
| 8,522,522 B2 | 9/2013 | Poisson | |
| 8,581,103 B2 | 11/2013 | Aspas Puertolas | |
| 8,794,584 B2 | 8/2014 | Shimada et al. | |
| 8,932,066 B2 * | 1/2015 | Broughton | H01R 12/61 439/67 |
| 8,937,254 B2 | 1/2015 | Wen et al. | |
| 9,010,716 B2 | 4/2015 | Kobori | |
| 9,040,821 B2 | 5/2015 | Blanchard et al. | |
| 9,139,144 B2 | 9/2015 | Broughton | |
| 9,259,808 B2 * | 2/2016 | Broughton | B23P 6/005 |
| 9,338,830 B2 * | 5/2016 | Broughton | H05B 3/28 |
| 9,456,472 B2 * | 9/2016 | Dalton | F02C 7/12 |
| 2002/0046870 A1 * | 4/2002 | Zein | H01B 7/0869 174/117 F |
| 2002/0084382 A1 * | 7/2002 | Crist | B64D 15/166 244/134 B |
| 2002/0086586 A1 | 7/2002 | Shi et al. | |
| 2002/0170729 A1 | 11/2002 | Murakami et al. | |
| 2002/0170740 A1 * | 11/2002 | Yamanobe | H01B 7/0838 174/117 F |
| 2003/0095389 A1 | 5/2003 | Samant et al. | |
| 2003/0155467 A1 * | 8/2003 | Petrenko | A63C 1/30 244/134 R |
| 2003/0183733 A1 | 10/2003 | Pisczak | |
| 2004/0065092 A1 | 4/2004 | Wadia et al. | |
| 2004/0238687 A1 | 12/2004 | Jones et al. | |
| 2004/0266266 A1 | 12/2004 | Lai | |
| 2004/0266274 A1 | 12/2004 | Naudet et al. | |
| 2005/0257956 A1 * | 11/2005 | Marshall | B29C 35/0272 174/260 |
| 2006/0272340 A1 | 12/2006 | Petrenko | |
| 2006/0278423 A1 | 12/2006 | Ichikawa et al. | |
| 2007/0018057 A1 | 1/2007 | Kovac | |
| 2007/0029454 A1 | 2/2007 | Suttie et al. | |
| 2007/0084216 A1 | 4/2007 | Mazeaud et al. | |
| 2007/0129902 A1 | 6/2007 | Orbell | |
| 2007/0170312 A1 * | 7/2007 | Al-Khalil | B64D 15/22 244/134 A |
| 2007/0234559 A1 | 10/2007 | Tokuda et al. | |
| 2008/0128048 A1 | 6/2008 | Johnson et al. | |
| 2008/0179448 A1 | 7/2008 | Layland et al. | |
| 2008/0185478 A1 | 8/2008 | Dannenberg | |
| 2008/0245932 A1 | 10/2008 | Prellwitz et al. | |
| 2009/0067979 A1 | 3/2009 | Braley et al. | |
| 2009/0072091 A1 | 3/2009 | Al-Khalil | |
| 2009/0095842 A1 * | 4/2009 | Gaertner, II | B64D 15/12 244/134 D |
| 2009/0134272 A1 * | 5/2009 | Vauchel | B64D 15/12 244/54 |
| 2009/0175718 A1 | 7/2009 | Diaz et al. | |
| 2009/0189051 A1 | 7/2009 | Love | |
| 2009/0230650 A1 | 9/2009 | Mayen et al. | |
| 2009/0242703 A1 | 10/2009 | Alexander et al. | |
| 2009/0277578 A1 | 11/2009 | Sung et al. | |
| 2009/0289232 A1 | 11/2009 | Rice | |
| 2010/0162726 A1 | 7/2010 | Robertson et al. | |
| 2010/0261365 A1 | 10/2010 | Sakakura | |
| 2010/0293987 A1 | 11/2010 | Horst et al. | |
| 2010/0308169 A1 * | 12/2010 | Blanchard | B29C 45/14639 244/130 |
| 2011/0011627 A1 | 1/2011 | Aspas Puertolas | |
| 2011/0014803 A1 | 1/2011 | Bailey | |
| 2011/0016882 A1 | 1/2011 | Woelke et al. | |
| 2011/0017879 A1 | 1/2011 | Woelke et al. | |
| 2011/0053468 A1 * | 3/2011 | Vontell | B24B 57/02 451/53 |
| 2011/0056961 A1 | 3/2011 | Amtmann et al. | |
| 2011/0111616 A1 | 5/2011 | Chang et al. | |
| 2011/0120748 A1 | 5/2011 | Bailey | |
| 2011/0236182 A1 * | 9/2011 | Wiebe | F01D 11/10 415/14 |
| 2011/0271655 A1 | 11/2011 | Poisson | |
| 2011/0315830 A1 | 12/2011 | Eshima et al. | |
| 2012/0012710 A1 * | 1/2012 | Yamaguchi | B64D 37/32 244/135 R |
| 2012/0103685 A1 * | 5/2012 | Blanchard | H02G 3/0431 174/72 A |
| 2012/0111614 A1 | 5/2012 | Free | |
| 2012/0149232 A1 | 6/2012 | Balzano | |
| 2012/0312022 A1 | 12/2012 | Lam et al. | |
| 2013/0048344 A1 | 2/2013 | Lou | |
| 2013/0092434 A1 * | 4/2013 | Kato | B60R 16/0215 174/72 A |
| 2013/0160291 A1 | 6/2013 | Broughton et al. | |
| 2013/0160458 A1 * | 6/2013 | Willmot | F02C 7/12 60/783 |
| 2013/0160460 A1 * | 6/2013 | Dalton | F02C 7/12 60/796 |
| 2013/0160464 A1 * | 6/2013 | Maszczk | F02C 7/20 60/796 |
| 2013/0160465 A1 | 6/2013 | Broughton et al. | |
| 2013/0161093 A1 | 6/2013 | Broughton et al. | |
| 2013/0189868 A1 * | 7/2013 | Fitt | H01R 13/518 439/272 |
| 2013/0316147 A1 | 11/2013 | Douglas et al. | |
| 2014/0208712 A1 * | 7/2014 | Dowdell | A62C 3/16 60/39.091 |
| 2014/0208770 A1 * | 7/2014 | Fitt | F16B 37/122 60/801 |
| 2014/0290271 A1 * | 10/2014 | Dalton | F02C 7/32 60/801 |
| 2014/0305134 A1 * | 10/2014 | Amarasinghe | F02C 7/32 60/796 |
| 2014/0305136 A1 * | 10/2014 | Taylor | F02C 7/32 60/801 |
| 2014/0325992 A1 * | 11/2014 | Summerfield | F02C 7/32 60/796 |
| 2014/0325993 A1 * | 11/2014 | Broughton | H01R 12/77 60/796 |
| 2014/0325994 A1 * | 11/2014 | Dowdell | H01R 12/77 60/801 |
| 2014/0326058 A1 * | 11/2014 | Broughton | G01M 15/14 73/112.01 |
| 2014/0327299 A1 * | 11/2014 | Broughton | F02C 7/00 307/9.1 |
| 2014/0328030 A1 * | 11/2014 | Broughton | F02C 7/32 361/749 |
| 2015/0342022 A1 * | 11/2015 | Willmot | H05K 1/0201 174/250 |
| 2016/0056578 A1 * | 2/2016 | Taylor | H01R 13/648 439/535 |
| 2016/0057873 A1 * | 2/2016 | Richardson | G01R 29/0835 324/627 |
| 2016/0069213 A1 * | 3/2016 | Fitt | F01D 25/24 415/121.3 |
| 2016/0072210 A1 * | 3/2016 | Armstrong | F02C 7/00 439/67 |
| 2016/0096288 A1 * | 4/2016 | Dowdell | F02C 7/32 415/200 |

FOREIGN PATENT DOCUMENTS

| | | | |
|---|---|---|---|
| EP | 1 741 879 A1 | 1/2007 | |
| EP | 1 760 291 A2 | 3/2007 | |
| EP | 1 762 714 A2 | 3/2007 | |
| EP | 2 279 852 A1 | 2/2011 | |
| EP | 2 590 270 A2 | 5/2013 | |
| FR | 2871284 A1 | 12/2005 | |
| GB | 1260339 | 1/1972 | |
| GB | 2 152 147 A | 7/1985 | |
| GB | 2477337 A * | 8/2011 | B64D 15/12 |
| JP | A-63-285808 | 11/1988 | |
| JP | A-4-167376 | 6/1992 | |
| JP | A-4-223067 | 8/1992 | |
| JP | A-5-129040 | 5/1993 | |

(56) References Cited

FOREIGN PATENT DOCUMENTS

| JP | A-2000-299151 | 10/2000 |
|---|---|---|
| WO | 0210587 A1 | 2/2002 |
| WO | 2009/118561 A1 | 10/2009 |
| WO | WO 2010/075390 A2 | 7/2010 |
| WO | WO 2011/061074 A1 | 5/2011 |
| WO | WO 2011/117609 A1 | 9/2011 |
| WO | WO 2011/127996 A1 | 10/2011 |

OTHER PUBLICATIONS

Aug. 15, 2014 Office Action issued in U.S. Appl. No. 13/716,497.
Dec. 1, 2015 Office Action issued in U.S. Appl. No. 13/716,808.
Apr. 23, 2014 European Search Report issued in European Patent Application No. 12 19 7402.
Apr. 24, 2014 European Search Report issued in European Patent Application No. 13 19 5848.
Oct. 25, 2013 European Search Report issued in European Patent Application No. 13 15 8531.
Jul. 31, 2012 Search Report issued in British Patent Application No. GB1207733.5.
Aug. 7, 2012 Search Report issued in British Patent Application No. GB1207735.0.
Oct. 23, 2012 Search Report issued in British Patent Application No. GB1212221.4.
Nov. 7, 2012 Search Report issued in British Patent Application No. GB1212223.0.
Fitt et al., U.S. Appl. No. 13/792,851, filed Mar. 11, 2013.
Maszczk et al., U.S. Appl. No. 13/716,796, filed Dec. 17, 2012.
Broughton et al., U.S. Appl. No. 13/716,503, filed Dec. 17, 2012.
Broughton et al., U.S. Appl. No. 13/716,708, filed Dec. 17, 2012.
Broughton et al., U.S. Appl. No. 13/716,516, filed Dec. 17, 2012.
Willmot et al., U.S. Appl. No. 13/716,300, filed Dec. 17, 2012.
Broughton et al., U.S. Appl. No. 13/716,439, filed Dec. 17, 2012.
Broughton et al., U.S. Appl. No. 13/716,254, filed Dec. 17, 2012.
Willmot et al., U.S. Appl. No. 13/716,808, filed Dec. 17, 2012.
Willmot et al., U.S. Appl. No. 13/716,239, filed Dec. 17, 2012.
Jul. 29, 2015 Office Action issued in U.S. Appl. No. 13/716,648.
Jul. 17, 2015 Office Action issued in U.S. Appl. No. 13/716,497.
Oct. 29, 2015 Office Action issued in Chinese Application No. 201210599254.0.
Feb. 16, 2016 Office Action issued in U.S. Appl. No. 13/716,503.
Apr. 20, 2012 Search Report issued in British Patent Application No. 1122140.5.
Apr. 19, 2012 Search Report issued in British Patent Application No. 1122143.9.
Jun. 21, 2012 Search Report issued in British Patent Application No. 1203991.3.
Aug. 5, 2013 Search Report issued in British Patent Application No. 1308033.8.
Broughton et al., U.S. Appl. No. 13/716,497, filed Dec. 17, 2012.
Broughton et al., U.S. Appl. No. 13/716,648, filed Dec. 17, 2012.
Broughton et al., U.S. Appl. No. 13/716,587, filed Dec. 17, 2012.
Dalton et al., U.S. Appl. No. 13/716,244, filed Dec. 17, 2012.
Jul. 28, 2015 Office Action issued in U.S. Appl. No. 13/716,796.
Jun. 12, 2015 Office Action in U.S. Appl. No. 13/716,254.
Jun. 5, 2015 Office Action issued in U.S. Appl. No. 13/716,708.
Mar. 11, 2015 Office Action issued in U.S. Appl. No. 13/716,300.
Nellis and Klein, "Heat Transfer", 2009, Campridge University, pp. 748-751.
Aug. 13, 2015 Office Action issued in U.S. Appl. No. 13/716,516.
Aug. 14, 2015 Office Action issued in U.S. Appl. No. 13/716,239.
Aug. 27, 2015 Office Action issued in U.S. Appl. No. 13/792,851.
Sep. 4, 2015 Office Action issued in U.S. Appl. No. 13/716,503.
Sep. 23, 2015 Office Action issued in U.S. Appl. No. 131716,439.
Oct. 7, 2015 Office Action issued in U.S. Appl. No. 13/716,587.
Feb. 25, 2015 Office Action issued in U.S. Appl. No. 13/716,497.
Aug. 11, 2016 Office Action Issued in U.S. Appl. No. 13/716,808.
Apr. 7, 2016 Office Action issued in U.S. Appl. No. 13/716,587.
Apr. 8, 2016 Office Action issued in U.S. Appl. No. 13/716,497.
Apr. 22, 2016 Office Action issued in U.S. Appl. No. 13/716,808.
Jun. 10, 2016 Office Action Issued in U.S. Appl. No. 13/716,503.
Sep. 23, 2016 Office Action Issued in U.S. Appl. No. 13/716,497.
Sep. 15, 2016 Office Action issued in U.S. Appl. No. 13/716,587.
Translation of Oct. 12, 2016 Office Action issued in Russian Patent Application No. 2012154565.
Dec. 2, 2016 Office Action issued in U.S. Appl. No. 13/716,503.
Jan. 20, 2017 Office Action issued in U.S. Appl. No. 13/716,808.
Feb. 2, 2017 Office Action issued in U.S. Appl. No. 13/716,587.
Apr. 10, 2017 Search Report issued in European Patent Application No. 12197394.
Jul. 28, 2017 Office Action issued in U.S. Appl. No. 13/716,497.
Jun. 19, 2015 Office Action issued in U.S. Appl. No. 13/716,244.
Nov. 10, 2014 Office Action issued in U.S. Appl. No. 13/716,300.
Nov. 20, 2014 Office Action issued in U.S. Appl. No. 13/716,648.
Sep. 8, 2017 Search Report issued in European Patent Application No. 12197391.

* cited by examiner

HEATED RIGID ELECTRICAL HARNESS FOR A GAS TURBINE ENGINE

CROSS-REFERENCE TO RELATED APPLICATIONS

This application is based upon and claims the benefit of priority from British Patent Application Number 1308033.8 filed 3 May 2013 and European Patent Application Number 12197402.6 filed 17 Dec. 2012, the entire contents of all of which are incorporated by reference.

BACKGROUND OF THE INVENTION

1. Field of the Invention

The present invention relates to a rigid electrical component, referred to as a rigid electrical raft, that is used to transmit electrical signals particularly, but not exclusively, around a gas turbine engine.

A typical gas turbine engine has a substantial number of electrical components which serve, for example, to sense operating parameters of the engine and/or to control actuators which operate devices in the engine. Such devices may, for example, control fuel flow, variable vanes and air bleed valves. The actuators may themselves be electrically powered, although some may be pneumatically or hydraulically powered, but controlled by electrical signals.

2. Description of the Related Art

Electrical power, and signals to and from the individual electrical components, is commonly transmitted along conductors. Conventionally, such conductors may be in the form of wires and/or cables which are assembled together in a harness. In such a conventional harness, each wire may be surrounded by an insulating sleeve, which may be braided or have a braided cover.

By way of example, FIG. 1 of the accompanying drawings shows a typical gas turbine engine including two conventional wiring harnesses 102, 104, each provided with a respective connector component 106, 108 for connection to circuitry, which may be for example accommodated within the airframe of an aircraft in which the engine is installed.

The harnesses 102, 104 are assembled from individual wires and cables which are held together over at least part of their lengths by suitable sleeving and/or braiding. Individual wires and cables, for example those indicated at 110, emerge from the sleeving or braiding to terminate at plug or socket connector components 112 for cooperation with complementary socket or plug connector components 114 on, or connected to, the respective electrical components.

Each conventional harness 102, 104 comprises a multitude of insulated wires and cables. This makes the conventional harness itself bulky, heavy and difficult to manipulate. The conventional harnesses occupy significant space within a gas turbine engine (for example within the nacelle of a gas turbine engine), and thus may compromise the design of the aircraft, for example the size and/or weight and/or shape of the nacelle.

Conventional harnesses comprise a large number of components, including various individual wires and/or bundles of wires, supporting components (such as brackets or cables) and electrical and/or mechanical connectors. This can make the assembly process complicated (and thus susceptible to errors) and/or time consuming. Disassembly of the conventional harnesses (for example removal of the conventional harnesses from a gas turbine engine during maintenance) may also be complicated and/or time consuming. Thus, in many maintenance (or repair or overhaul) procedures on a gas turbine engine, removal and subsequent refitting of the conventional electrical harness may account for a very significant portion of the operation time and/or account for a significant proportion of the potential assembly errors.

The electrical conductors in the conventional harnesses may be susceptible to mechanical damage. For example, mechanical damage may occur during installation (for example through accidental piercing of the protective sleeves/braiding) and/or during service (for example due to vibration). In order to reduce the likelihood of damage to the conductors in a conventional harness, the protective sleeves/braiding may need to be further reinforced, adding still further weight and reducing the ease with which they can be manipulated. Similarly, the exposed electrical connectors used to connect one conductor to another conductor or conductors to electrical units may be susceptible to damage and/or may add significant weight to the engine.

There is also a requirement for heating energy to be provided at various locations on a gas turbine engine. For example, heating may be required to prevent ice build-up in certain areas, such as around the engine intake. By way of further example, heating may be required to prevent condensation build-up in certain areas (such as around electrical components), and to provide heating to fluids, such as fuel and oil.

Typically, a number of dedicated components are required to provide heating to each location at which it is required. Such dedicated components add weight, complexity and expense to the engine, but a necessary to ensure that the appropriate heating is provided.

OBJECTS AND SUMMARY OF THE INVENTION

It is desirable to reduce the complexity, weight and cost of the engine, and it will be appreciated that the conventional electrical systems and heating systems provide a significant contribution to the weight, complexity and cost of a typical engine. It is also desirable to improve the reliability of the electrical and heating systems of the engine.

According to an aspect, there is provided a rigid electrical raft comprising electrical conductors embedded in a rigid material, the electrical conductors being arranged to form part of an electrical system. The rigid electrical raft also comprises electrical heating elements embedded in the rigid material and arranged to provide electrical heating (to the rigid electrical raft, for example). The electrical heating elements are arranged to output/emit more heat energy per unit length than the electrical conductors in use.

Thus, the present invention provides a single component that provides both heating and electrical transmission. This is more compact, less complex, lighter and cheaper than providing separate heating and electrical systems. Furthermore, embedding the electrical conductors and the electrical heating elements in a rigid material provides protection to those components, both in use and during assembly, thereby reducing the susceptibility to damage and improving the reliability of the electrical and heating systems.

The electrical heating elements may be distinguished from the electrical conductors in that they may be constructed and arranged to emit heat (for example more heat than the electrical conductors) when a current is passed through. For example, for a given current, the electrical heating elements may emit more heat than the electrical conductors. This may be achieved in any suitable way. For example, the cross-sectional area of the electrical heating elements may be smaller than the cross-sectional area of the electrical conductors. By reducing the cross-sectional area of the electrical heating elements, their resistance may be increased, thereby increasing the heat generated for a given current.

Additionally or alternatively, the electrical heating elements may be manufactured using a higher resistance material than the electrical conductors. For example, Nichrome or cupronickel may be used to manufacture the electrical heating elements. The precise arrangement of the electrical heating elements may be determined by balancing the need to generate sufficient heat to fulfil their purpose, whilst avoiding overheating the material in which they are embedded.

The electrical heating elements may be located at a position within the rigid electrical raft at which the heating is required. This may be, for example, near to a surface of the raft.

The electrical conductors may be used to transfer electrical signals and thus may, for example, take the place of a conventional electrical harness. In general, transferring electrical signals using the embedded electrical conductors of the rigid electrical raft can provide a number of further advantages over transferring electrical signals using a conventional harness, as discussed herein. For example, the use of such rafts may significantly reduce the build and maintenance times of an engine, and/or reduce the possibility of errors occurring during such procedures. The rigid electrical rafts can also provide weight and size advantages over conventional harnesses. There is very little (if any) additional weight and/or size penalties for additionally incorporating the electrical heating elements, thus making the use of rigid electrical rafts even more attractive.

According to an aspect, there is provided an anti-icing system comprising a rigid electrical raft as described above and elsewhere herein. The electrical heating elements may be constructed and arranged to prevent ice build-up on at least a part of the rigid electrical raft. In this regard, prevention of ice build-up may include prevention of ice formation and/or removal of ice that has already formed.

According to an aspect, there is provided an anti-condensation system comprising a rigid electrical raft as described above and elsewhere herein. The electrical heating elements may be constructed and arranged to prevent condensation build-up on at least a part of the rigid electrical raft. In this regard, prevention of condensation build-up may include prevention of condensation formation and/or removal of condensation that has already formed. Such an anti-condensation system may be used, for example, to prevent condensation forming in or on electrical components (including sensors) that may be damaged and/or rendered inaccurate by such condensation.

In such anti-icing and/or anti-condensation systems, the part of the rigid electrical raft on which the electrical heating elements may be constructed and arranged to prevent ice and/or condensation build-up may be an external surface, for example an external surface of an aircraft and/or engine, such as an engine intake or nacelle. The rigid electrical raft may be a part of an external surface of, for example, a vehicle, for example an aircraft and/or a gas turbine engine.

Additionally or alternatively, the part of the rigid electrical raft on which the electrical heating elements may be constructed and arranged to prevent ice and/or condensation build-up may be an internal surface, for example a surface of a fluid passageway that may optionally be formed in the rigid electrical raft, as described elsewhere herein.

According to an aspect, there is provided a fluid tank formed at least in part using a rigid electrical raft as described herein. The electrical heating elements may be constructed and arranged so as to provide, in use, heating to fluid contained in the fluid tank.

Such a fluid tank may be formed of the rigid material. For example, the tank may be formed by a chamber created in the raft during moulding or laying up of the raft.

The tank may be lined, for example with a metal liner.

The tank may be an oil tank. Alternatively, the tank may be a fuel tank. For example, when the tank is an oil tank, the oil can be engine oil. When the tank is a fuel tank, the fuel can be drainage fuel drained from a fuel manifold of the engine after engine shutdown.

The tank may have a filler cap, e.g. so that the liquid can be replenished in the tank. The tank may have a pressure relief valve, which can help to prevent over-pressurisation of the liquid. The tank may have a sight glass, which can allow maintenance staff to determine the contents of the tank. The tank may have a filter for the liquid, e.g. so that the liquid can be kept free of debris.

The tank may have a liquid quantity sensor and/or a liquid temperature sensor (such as a thermocouple). The liquid quantity sensor can provide information about the amount of liquid left in the tank. The liquid temperature sensor can help to prevent over-heating or under-heating of the liquid. Conveniently, power and/or signal cables for the or each sensor can be embedded in the rigid material.

The tank may have a liquid pressure sensor. The tank may have one or more magnetic chip detectors for detecting metal debris in the liquid. Such detectors can be particularly useful in relation to engine oil as they can provide warning of e.g. bearing wear. Power and/or signal cables for the sensor and/or the detector(s) can be embedded in the rigid material, for example in the form of the electrical conductors embedded in the rigid electrical raft.

Such a fluid tank formed at least in part by the rigid electrical raft having electrical heating elements may be particularly useful in relation to a tank for engine oil. For example, gas turbine engine oil tanks and systems generally have to pass a "de-congeal test" before being given an airworthiness certificate. In such a test, the engine is cooled to −40° centigrade, which causes the oil to become waxy. On start-up, the engine must survive without damage until sufficient heat has been transferred into the oil to cause it to de-congeal. The test may stipulate that de-congealing must occur within 5 minutes. However, preferably less time is required. A reason is that in order to reduce fuel consumption during taxiing, there is a development at the aircraft level to tow the aircraft to the end of the runway or use electrical power rather than the engine thrust. Thus engines may be started only shortly before take-off and so have less time to heat up before going to high power.

The tank may have a liquid inlet port and a liquid outlet port. For example, the inlet port may be fed by a liquid flow passage that is embedded in the rigid material, and/or the outlet port may feed a liquid flow passage that is embedded in the rigid material.

According to an aspect, the rigid electrical raft may be part of a rigid electrical raft assembly. The rigid electrical raft assembly may further comprise an electrical (or electronic) component (or unit) mounted to the rigid electrical raft. The electrical heating elements may be constructed and arranged to heat the electrical component such that it is maintained at a desired temperature, or within a range of desired temperatures. Mounting the electrical component to the rigid electrical raft may mean that the electrical component is mounted on the rigid electrical raft (for example on a surface of the rigid electrical component) or mounted in the rigid material (for example at least partially embedded in the rigid material).

The electrical component may be an electrical unit or sensor, for example an ECU, for example an engine health monitoring unit (EMU) or an Engine Electronic Controller (EEC). Such units may, for example, comprise crystal oscillators which may not operate satisfactorily (or even at all) below a certain minimum temperature. The embedded electrical heating elements may be used to keep such crystal oscillators above this temperature.

Additionally or alternatively, such an electrical component may be a thermocouple that includes a cold junction compensator used to connect the thermocouple to electrical wires/tracks. Such a cold junction compensator may require a stable temperature to operate effectively. The embedded electrical heating elements may be used to provide such a stable temperature.

The electrical component mounted to the rigid electrical raft may be in electrical contact with the embedded electrical conductors, as required.

Further optional features of the invention are set out below. These are applicable singly or in any combination with any aspect of the invention.

The electrical heating elements may be electrically connected to the electrical conductors. This may allow electrical power to be supplied to the electrical heating elements by the electrical conductors. In this way, the heating system and the electrical system can be further integrated, thereby potentially enhancing the advantages described herein, for example in terms of complexity, cost, weight, and size.

The rigid electrical raft may comprise an electrical heating control system in communication with the electrical heating elements. The electrical heating control system may be arranged to control the heating provided by the electrical heating elements. For example, the electrical heating control system may control the power supplied to the electrical heating elements, for example when power is supplied to the embedded electrical heating elements and/or the power level supplied to the electrical heating elements, for example through power modulation. Such an electrical control system may be provided as part of the rigid electrical raft (for example mounted to or embedded in the rigid electrical raft), or as an additional component in electrical communication with the rigid electrical raft.

The rigid electrical raft may further comprise a temperature sensor arranged to measure the temperature at a specific region of the rigid electrical raft. The electrical heating elements may be provided to one or more specific regions of the rigid electrical raft. A temperature sensor may be located so as to measure the temperature at or near to a specific region at which the electrical heating elements are provided. In this way, the temperature of the regions to which the electrical heating elements are provided may be monitored.

The temperature sensor may be a part of the electrical heating control system. Thus, the temperature sensor may be used to control the power supply to the electrical heating elements, and thus to control the temperature at that region/location. At least some of the embedded electrical conductors may be used to transmit electrical signals to and/or from the temperature sensor. Thus, the control system for the electrical heating elements may be at least in part integral to the raft itself, and thus may be particularly compact, robust and/or self contained.

The rigid electrical raft may comprise at least one fluid passage embedded in the rigid material. The embedded fluid passage(s) may be at least a part of a fluid system, such as a gas (for example pneumatic or cooling gas/air) and/or liquid (for example a fuel, hydraulic and/or lubricant liquid). In arrangements where the rigid electrical raft forms at least a part of a fluid tank, at least one embedded fluid passage may be in fluid communication with the tank, for example as an inlet to the tank or an outlet from the tank.

At least one of the electrical heating elements may be positioned so as to provide heat to such an embedded fluid passage. This may provide various advantages. For example it may prevent condensation and/or ice from forming in the fluid passage and/or it may provide heat to ensure that fluid that in the passage is maintained at the optimum/desired temperature, or within a range of temperatures.

Any suitable material may be used for the rigid material of the electrical raft. For example, the rigid material may be a rigid composite material, such as an organic matrix composite material. Such a rigid composite material may be particularly stiff and/or lightweight. Thus, a rigid composite raft may be used that has suitable mechanical properties, whilst being thin and lightweight, for example compared with some other materials. The rigid composite material may comprise any suitable combination of resin and fibre as desired for a particular application. For example, any of the resins and/or fibres described herein may be used to produce a rigid composite material for the electrical raft. Any suitable fibres may be used, for example carbon fibres, glass fibres, aramid fibres, and/or para-aramid fibres. The fibres may be of any type, such as woven and/or chopped. Any suitable resin may be used, for example epoxy, BMI (bismaleimide), PEEK (polyetheretherketone), PTFE (polytetraflouroethylene), PAEK (polyaryletherketone), polyurethane, and/or polyamides (such as nylon).

In any example of rigid electrical raft or rigid electrical raft assembly, at least one of the electrical conductors and/or at least one of the electrical heating elements embedded in the electrical raft may be an electrically conductive wire. The or each electrically conductive wire may be surrounded by an electrically insulating sleeve.

At least some (for example a plurality) of the electrical conductors and/or the electrical heating elements may be provided in a flexible printed circuit (FPC). Thus, at least some of the electrical conductors and/or electrical heating elements may be provided as electrically conductive tracks in a flexible substrate. The flexible printed circuit may be flexible before being embedded in the rigid material.

Providing the electrical conductors and/or the electrical heating elements as tracks in a flexible printed circuit may allow the size of the resulting rigid electrical raft to be reduced further and/or substantially minimized. For example, many different electrical conductors/heating elements may be laid into a flexible printed circuit in close proximity, thereby providing a compact structure. The flexible substrate of a single flexible printed circuit may provide electrical and/or mechanical protection/isolation to a large number of electrical conductors/heating elements, and may be particularly convenient to handle, for example during manufacture.

Any given electrical raft may be provided with one or more electrical wires embedded therein (which may be sheathed) and/or one or more flexible printed circuits embedded therein. As such, a given electrical raft may have wires and flexible printed circuits laid therein.

It will be appreciated that the embedded electrical conductors and embedded electrical heating elements (whether they are provided as embedded electrical wires or as conductive tracks in a flexible printed circuit embedded in the rigid material) may be described as being fixed in position by the rigid material, for example relative to the rest of the electrical harness raft. It will also be appreciated that the embedded electrical conductors and electrical heating elements may be said to be surrounded by the rigid material and/or buried in the rigid material and/or integral with (or integrated into) the rigid material.

According to an aspect, there is provided a gas turbine engine comprising an electrical system. The electrical system comprises as least one of: a rigid electrical raft; an anti-icing system; an anti-condensation system; a fluid tank; or a rigid electrical raft assembly as described herein. As such, there is provided a gas turbine engine comprising one or more rigid electrical raft as described herein. Such a rigid electrical raft may be mounted to the gas turbine engine.

Such a gas turbine engine may also comprise other rigid electrical rafts that are as described and claimed herein (having electrical conductors embedded in a rigid material), but without the embedded electrical heating elements. In general, a rigid electrical raft assembly may comprise a rigid electrical raft (which may have electrical heating elements embedded therein in accordance with aspects of the invention) with a component, which may be a part of an electrical system or a fluid system for example, mounted to (for example on or in) the rigid electrical raft. Thus, it will be appreciated that advantages associated with rigid electrical rafts (which may be referred to herein simply as electrical rafts) also apply to rigid electrical raft assemblies.

A rigid electrical raft (or rigid electrical raft assembly) may be at least a part of an electrical harness for a gas turbine engine, and thus may be referred to herein as an electrical harness raft (or electrical harness raft assembly). Thus, a rigid electrical raft may be part of an electrical harness arranged to transfer electrical signals around the engine.

Accordingly, there is provided an electrical harness for a gas turbine engine arranged to transmit electrical signals around the gas turbine engine, wherein the electrical harness comprises a rigid electrical raft, and the rigid electrical raft comprises:

electrical conductors embedded in a rigid material, at least some of the electrical conductors being arranged to transmit the electrical signals; and electrical heating elements embedded in the rigid material and arranged to provide electrical heating, wherein the electrical heating elements are constructed and arranged to output more heat energy per unit length than the electrical conductors.

At least some of the electrical heating elements are electrically connected to the electrical conductors, such that electrical power is supplied to the electrical heating elements by the electrical conductors.

There is also provided a gas turbine engine comprising such an electrical harness, as described by way of example herein. The electrical signals transferred by the conductors in the electrical raft, and around the engine using the electrical rafts/raft assemblies may take any form. For example, the electrical signals may include, by way of non-limitative example, electrical power and/or electrical control/communication signals and/or any other type of transmission through an electrical conductor. Transmission of signals around the engine may mean transmission of signals between (to and/or from) any number of components/systems in the engine and/or components/system of a structure (such as an airframe) to which the gas turbine engine is (or is configured to be) connected/installed in. In other words, an electrical raft may be used to transfer/communicate any possible combination of electrical signals in any part of a gas turbine engine installation or a related (for example electrically and/or mechanically connected) structure/component/system.

In general, the use of one or more rigid electrical rafts/electrical raft assemblies (whether or not they include the embedded electrical heating elements in addition to the embedded electrical conductors) may provide a number of advantages over the use of a conventional electrical harness in a gas turbine engine. For example, rigid electrical may significantly reduce build time of an engine. For example, use of electrical rafts/electrical raft assemblies may significantly reduce the part count involved in engine assembly compared with a conventional harness arrangement. The number and/or complexity of the operations required to assemble an engine (for example to assemble/install the electrical system (or network) and/or other peripheral components, which may be referred to in general as engine dressing) may be reduced. For example, rather than having to install/assemble a great number of wires and/or wiring looms together on the engine installation, it may only be necessary to attach a relatively small number of electrical rafts/electrical raft assemblies, which themselves may be straightforward to handle, position, secure and connect. Thus, use of electrical rafts and electrical raft assemblies in a gas turbine installation may reduce assembly time and/or reduce the possibility of errors occurring during assembly.

Use of electrical raft assemblies may provide significant advantages during maintenance, such as repair and overhaul. As discussed above, the electrical rafts may be particularly quick and straightforward to assemble. The same advantages discussed above in relation to assembly apply to disassembly/removal from the gas turbine engine. Thus, any repair/overhaul that requires removal of at least a part of the electrical harness may be simplified and/or speeded up through use of electrical rafts as at least a part of the electrical harness, for example compared with conventional harnesses. Use of electrical rafts (for example as part of one or more electrical raft assemblies) may allow maintenance procedures to be advantageously adapted. For example, some maintenance procedures may only require access to a certain portion of the gas turbine engine that only requires a part of the harness to be removed. It may be difficult and/or time consuming, or not even possible, to only remove the required part of a conventional harness from a gas turbine engine. However, it may be relatively straightforward to only remove the relevant electrical raft, for example by simply disconnecting it from the engine and any other electrical rafts/components to which it is connected. Decreasing maintenance times has the advantage of, for example, reducing out-of service times (for example off-wing times for engines that are used on aircraft).

The build/assembly times may be additionally or alternatively reduced by pre-assembling and/or pre-testing individual and/or combinations of electrical rafts and/or electrical raft assemblies prior to engine assembly. This may allow the electrical and/or mechanical operation of the electrical rafts to be proven before installation, thereby reducing/eliminating the testing required during engine installation.

Accordingly, there is provided (and aspects of the invention may be used with/as a part of) a method of servicing a gas turbine engine, the method comprising: removing a first rigid electrical raft from the gas turbine engine; and installing a second, pre-prepared, rigid electrical raft onto the gas turbine engine in place of the first raft.

As mentioned above, the electrical rafts/electrical raft assemblies may be a particularly lightweight solution for transferring electrical signals around an engine. For example, an electrical raft may be lighter, for example significantly lighter, than a conventional harness required to transmit a given number of electrical signals. A plurality of conductors may be embedded in a single electrical raft, whereas in a conventional arrangement a large number of heavy, bulky wires, usually with insulating sleeves, would be required. The reduced weight may be particularly advantageous, for example, when used on gas turbine engines on aircraft.

Electrical rafts may be more easily packaged and/or more compact, for example than conventional harnesses. Indeed, the electrical rafts can be made into a very wide range of shapes as desired. This may be achieved, for example, by manufacturing the electrical rafts using a mould conforming to the desired shape. As such, each electrical raft may be shaped, for example, to turn through a tighter corner (or smaller bend radius) than a conventional harness. The electrical rafts may thus provide a particularly compact solution for transferring electrical signals around a gas turbine engine. The electrical rafts may be readily shaped to conform to neighbouring components/regions of a gas turbine engine, for example components/regions to which the particular electrical raft assembly is attached, such as a fan casing or a core casing.

An electrical raft or raft assembly may be provided in any suitable location/position of the gas turbine engine, for example to a mounting structure at any suitable location. For example, the gas turbine engine may comprise a bypass flow duct formed between an engine core and an engine fan casing (the gas turbine engine may be a turbofan engine, for example); and the electrical raft assembly may form at least a part of a radially extending splitter (which may be referred to as a bifurcation) that extends across the bypass flow duct. In this way, an electrical raft (which may be referred to as a splitter electrical raft) may provide an electrical connection between a fan casing and an engine core. By way of further example, the electrical raft assembly may be attached to the engine core case or engine fan case, for example to a mounting structure on such cases.

The electrical raft(s) may provide improved protection to the electrical conductors and/or electrical heating assemblies during manufacture/assembly of the raft/gas turbine engine, and/or during service/operation/maintenance of the gas turbine engine. This may result in lower maintenance costs, for example due to fewer damaged components requiring replacement/repair and/or due to the possibility of extending time intervals (or service intervals) between inspecting the electrical system, for example compared with a system using only conventional harnesses.

According to an aspect, there is provided a gas turbine engine comprising an electrical system having a rigid electrical raft as described herein, wherein the rigid electrical raft is a first electrical engine installation component. The rigid electrical raft may be mounted to the gas turbine engine. The electrical system also comprises a second electrical engine installation component. The electrical system further comprises a flexible cable to electrically connect the first electrical engine installation component to the second electrical engine installation component. The flexible cable may be, for example, one or more conductive wires and/or one or more flexible printed circuits.

The second engine installation component may be, for example, an ECU, such as an EMU or EEC. Additionally or alternatively, the second engine installation component may be a further electrical raft or electrical raft assembly.

The environment of a gas turbine engine during operation may be particularly severe, with, for example, high levels of vibration and/or differential expansion between components as the temperature changes through operation and as the components move relative to each other. Providing at least one flexible cable to connect an electrical raft assembly to another component may allow the electrical rafts and/or components to accommodate vibration and/or relative movement, for example of the component(s)/assemblies to which they are attached/mounted during use. For example, the flexible cable(s) (where present) used to electrically connect electrical raft assemblies to other component(s) may have sufficient length to accommodate such vibration and/or movement during use.

For example, providing separate (for example more than one) electrical raft assemblies and connecting at least some (for example at least two) of them together using at least one flexible cable may allow the electrical rafts to accommodate vibration and/or relative movement of the component(s)/assemblies to which they are attached/mounted during use.

The electrical raft may comprise one or more electrical connectors or sockets, which may be electrically connected to at least one of the embedded electrical conductors. The electrical connector or socket may allow electrical connection of the electrical raft to other electrical components, for example to other electrical rafts (either directly or indirectly, via an electrical cable or lead) or to electrical units (again, either directly or indirectly, via an electrical cable or lead). Such an electrical connector or socket may take any suitable form, and may be at least partially embedded in the rigid electrical raft.

According to an aspect, there is provided a method of assembling a rigid electrical raft or rigid electrical raft assembly and/or a gas turbine engine. The method comprises preparing a rigid electrical raft assembly as described above and elsewhere herein. The method also comprises electrically and mechanically connecting the prepared electrical raft assembly to the rest of the apparatus/gas turbine engine.

As mentioned above, other components/systems of a gas turbine engine may be provided to a rigid electrical raft. The resulting apparatus may be an example of a rigid electrical raft assembly. Such other components/systems of a gas turbine engine may be provided to a rigid electrical raft in any suitable manner. For example, such other components/systems may be mounted on one or more rigid raft assemblies. Thus, a surface of a rigid raft may be used as a mounting surface for other gas turbine engine components/systems, such as ancillary/auxiliary components/systems.

For example, as mentioned above, an electrical unit may be mounted on an electrical raft. The electrical unit may be any sort of electrical unit, for example one that may be provided to a gas turbine engine. For example, the electrical unit may be any type of electronic control unit (ECU), such as an Electronic Engine Controller (EEC) and an Engine Health Monitoring Unit (EMU). At least one (i.e. one or more) electrical unit may be attached to an electrical raft. Such an electrical raft assembly may be a particularly convenient, lightweight and/or compact way of providing (for example attaching, fixing or mounting) an electrical unit to a turbine engine. For example, the electrical unit and the electrical raft may be assembled together (mechanically and/or electrically) before being installed on the gas turbine engine, as described elsewhere herein. The embedded electrical heating elements may provide heat to such an electrical unit to ensure that it is kept within an operating temperature range and/or to prevent condensation and/or ice build-up.

An electrical raft may be provided with at least one mount on which other components (for example auxiliary/ancillary components/systems) of the gas turbine engine are (or may be) mounted. The mount may be a bracket, for example a bespoke bracket for the component/system mounted thereon or a conventional/standard bracket. The electrical raft may provide a stable, regular and convenient platform on which to mount the various systems/components. The combination of the installed electrical raft assembly with components/systems mounted thereon may be much more compact and/or straightforward to assemble and/or have a greatly reduced number of component parts, for example compared with the corresponding conventional electrical harness and separately mounted components/systems.

The mounts may be used to attach any component/system to an electrical raft (and thus to the engine) as required. For example, fluid pipes for transferring fluid around the engine may be mounted to the electrical rafts (for example mechanically mounted using a bracket), and thus to the engine. More than one set of fluid pipes, for example for carrying different or the same fluids, may be mounted on the same electrical raft.

An anti-vibration mount may be used to attach an electrical raft to another component, thereby allowing the electrical raft to be vibration isolated (or at least substantially vibration isolated). Using an anti-vibration mount to attach an electrical raft/assembly to a gas turbine engine for example may reduce (or substantially eliminate) the amount (for example the amplitude and/or the number/range of frequencies) of vibration being passed to the electrical raft from the gas turbine engine, for example during use. This may help to prolong the life of the electrical raft. Furthermore, any other components that may be attached to the electrical raft (as discussed above and elsewhere herein) may also benefit from being mounted to the gas turbine engine via the anti-vibration mounts, through being mounted on the electrical raft. For example, the reduced vibration may help to preserve the electrical contact between the electrical raft and any electrical unit connected thereto. As such, any components (such as an electrical unit mounted to the electrical raft) that would conventionally be mounted directly to the gas turbine engine and require at least a degree of vibration isolation no longer require their own dedicated anti-vibration mount. Thus, the total number of anti-vibration mounts that are required to assemble an engine may be reduced. This may reduce the number of parts required and/or the time taken to assemble an engine or engine installation and/or reduce the total assembled weight and/or reduce the likelihood of errors occurring during assembly.

Furthermore, components that are conventionally mounted to an engine without anti-vibration mounts (for example because of the weight and/or cost penalty), but which are now mounted to an electrical raft (for example to a mounting surface of the electrical raft), may benefit from vibration isolation without any weight/cost/assembly time penalty. This may reduce the possibility of damage occurring to such components and/or increase their service life. Such components may include, for example, ignitor boxes (used to provide high voltage power to engine ignitors), and pressure sensors/switches, for example for fluid systems such as oil, air, fuel, pneumatics and/or hydraulics.

Further optional features of the invention are set out below.

BRIEF DESCRIPTION OF THE DRAWINGS

Embodiments of the invention will now be described by way of example with reference to the accompanying drawings in which.

DETAILED DESCRIPTION OF THE PREFERRED EMBODIMENTS

Figure 1:
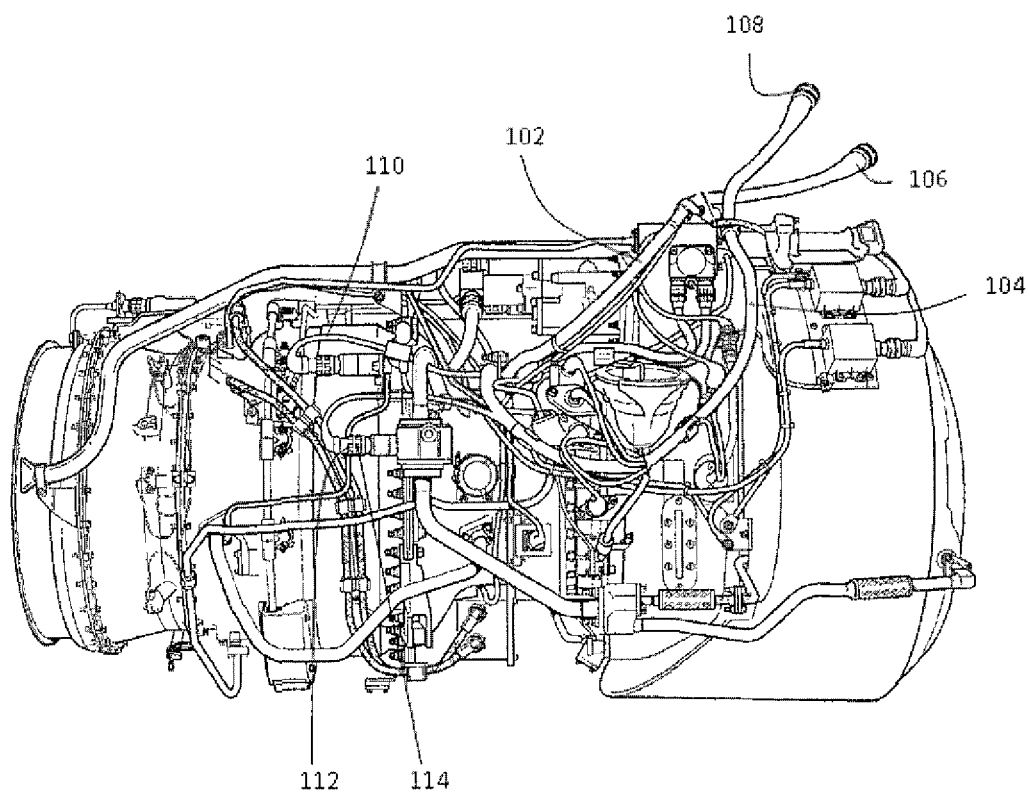
FIG. 1 shows a gas turbine engine with a conventional harness.
Figure 2:
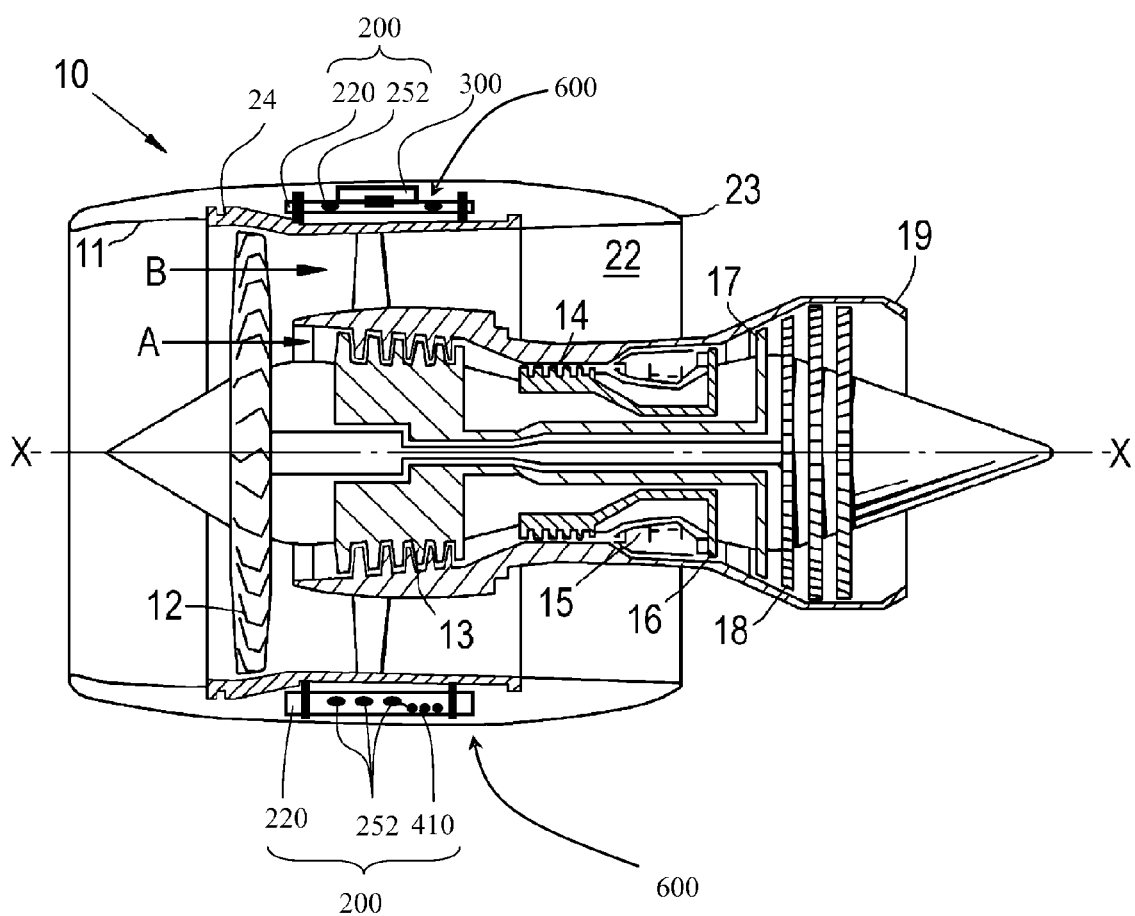
FIG. 2 shows a cross-section through a gas turbine engine having rigid electrical rafts in accordance with the present invention.

With reference to FIG. 2, a ducted fan gas turbine engine generally indicated at 10 has a principal and rotational axis X-X. The engine 10 comprises, in axial flow series, an air intake 11, a propulsive fan 12, an intermediate pressure compressor 13, a high-pressure compressor 14, combustion equipment 15, a high-pressure turbine 16, and intermediate pressure turbine 17, a low-pressure turbine 18 and a core engine exhaust nozzle 19. The engine also has a bypass duct 22 and a bypass exhaust nozzle 23.

The gas turbine engine 10 works in a conventional manner so that air entering the intake 11 is accelerated by the fan 12 to produce two air flows: a first air flow A into the intermediate pressure compressor 13 and a second air flow B which passes through the bypass duct 22 to provide propulsive thrust. The intermediate pressure compressor 13 compresses the air flow A directed into it before delivering that air to the high pressure compressor 14 where further compression takes place.

The compressed air exhausted from the high-pressure compressor 14 is directed into the combustion equipment 15 where it is mixed with fuel and the mixture combusted. The resultant hot combustion products then expand through, and thereby drive the high, intermediate and low-pressure turbines 16, 17, 18 before being exhausted through the nozzle 19 to provide additional propulsive thrust. The high, intermediate and low-pressure turbines 16, 17, 18 respectively drive the high and intermediate pressure compressors 14, 13 and the fan 12 by suitable interconnecting shafts.

The gas turbine engine 10 shown in FIG. 2 shows two electrical raft assemblies 600 according to the invention, at least one of which may be a rigid raft in accordance with the invention. As such, the gas turbine engine 10 is in accordance with the present invention. Each electrical raft assembly 600 comprises an electrical raft 200. The electrical rafts 200 may be used to transmit/transfer electrical signals (or electricity, including electrical power and/or electrical control signals) around the engine and/or to/from the engine 10 from other components, such as components of an airframe. The function and/or construction of each electrical raft 200 and electrical raft assembly 600 may be as described above and elsewhere herein.

In FIG. 2, each electrical raft 200 (which may be referred to herein simply as a raft 200 or an electrical harness raft 200) comprises at least one electrical conductor 252 embedded in a rigid material 220, which may be a rigid composite material.

In addition to the embedded electrical conductors 252, one of the rigid electrical rafts 200 comprises embedded heating elements 410. The embedded heating elements 410 may be arranged to provide heating for any desired purpose. For example, the embedded heating elements 410 may be arranged to provide electrical heating to prevent ice build-up on the surface of the electrical raft 200. The rigid electrical raft comprising embedded heating elements 410 and embedded electrical conductors 252 is described in detail below, for example in relation to FIGS. 6 and 7.

The electrical conductors 252 and/or the electrical heating elements 410 in the electrical raft 200 may be provided in a harness 250, which may be a flexible printed circuit board (or FPC) 250.

Figure 3:
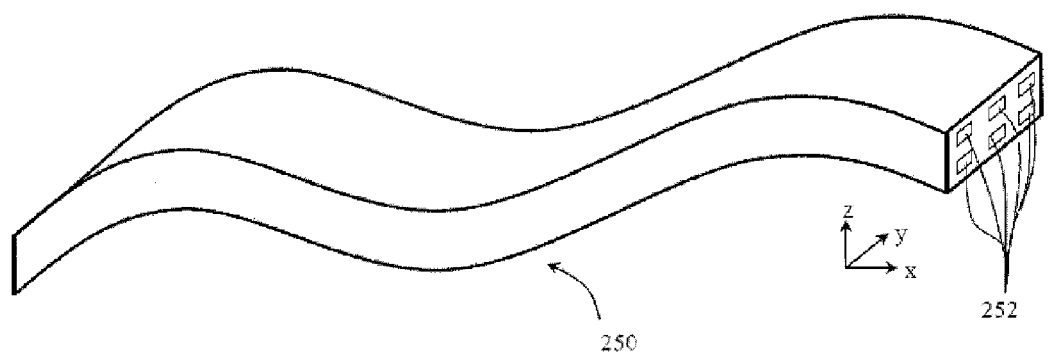
FIG. 3 shows a perspective view of a flexible printed circuit.
Figure 4:
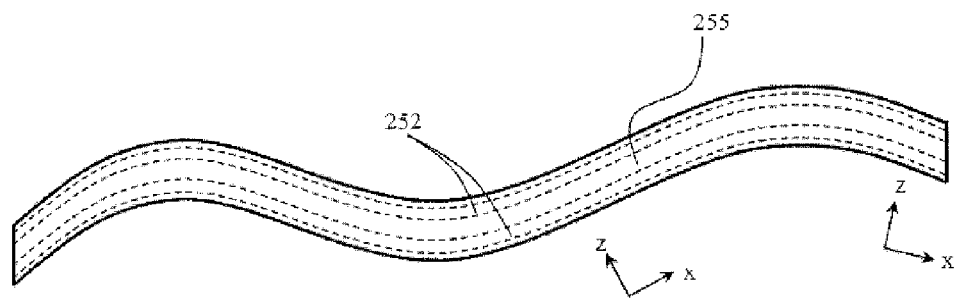
FIG. 4 shows a side view of the flexible printed circuit of FIG. 3.

An example of an FPC 250 in which the electrical conductors 252 may be provided is shown in greater detail in FIGS. 3 and 4. FIG. 3 shows a perspective view of the FPC 250, and FIG. 4 shows a side view. Although FIGS. 3 and 4 show the electrical conductors 252 embedded as part of a FPC 250, it will be appreciated that the heating elements 410 may also be formed as part of an FPC. Indeed, both the electrical conductors 252 and the electrical heating elements 410 may be a part of the same FPC 250.

Such an FPC 250 may comprise a flexible (for example elastically deformable) substrate 255 with conductive tracks 252 (which are a type of electrical conductor 252 as referred to elsewhere herein) laid/formed therein. The FPC 250 may thus be deformable. The FPC 250 may be described as a thin, elongate member and/or as a sheet-like member. Such a thin, elongate member may have a major surface defined by a length and a width, and a thickness normal to the major surface. In the example shown in FIGS. 3 and 4, the FPC 250 may extend along a length in the x-direction, a width in the y-direction, and a thickness (or depth or height) in the z-direction. The x-direction may be defined as the axial direction of the FPC. Thus, the x-direction (and thus the z-direction) may change along the length of the FPC 250 as the FPC is deformed. This is illustrated in FIG. 4. The x-y surface(s) (i.e. the surfaces formed by the x and y directions) may be said to be the major surface(s) of the FPC 250. In the example shown in FIGS. 3 and 4, the FPC 250 is deformable at least in the z direction, i.e. in a direction perpendicular to the major surface. FPCs may be additionally of alternatively deformable about any other direction, and/or may be twisted about any one or more of the x, y, or z directions.

The flexible substrate 255 may be a dielectric. The substrate material may be, by way of example only, polyamide. As will be readily apparent, other suitable substrate material could alternatively be used.

The conductive tracks 252, which may be surrounded by the substrate 255, may be formed using any suitable conductive material, such as, by way of example only, copper, copper alloy, tin-plated copper (or tin-plated copper alloy), silver-plated copper (or silver-plated copper alloy), nickel-plated copper (or nickel-plated copper alloy) although other materials could alternatively be used. The conductive tracks 252 may be used to conduct/transfer electrical signals (including electrical power and electrical control signals) through the rigid raft assembly (or assemblies) 200, for example around a gas turbine engine 10 and/or to/from components of a gas turbine engine and/or an airframe attached to a gas turbine engine.

The size (for example the cross-sectional area) and/or the shape of the conductive tracks 252 may depend on the signal(s) to be transmitted through the particular conductive track 252. Thus, the shape and/or size of the individual conductive tracks 252 may or may not be uniform in a FPC 250.

The example shown in FIGS. 3 and 4 has six conductive tracks 252 running through the substrate 255. However, the number of conductive tracks 252 running through a substrate 255 could be fewer than six, or greater than six, for example tens or hundreds of tracks, as required. As such, many electrical signals and/or power transmission lines may be incorporated into a single FPC 250.

A single FPC 250 may comprise one layer of tracks, or more than one layer of tracks, for example, 2, 3, 4, 5, 6, 7, 8, 9, 10 or more than 10 layers of tracks. An FPC may comprise significantly more than 10 layers of tracks, for example at least an order of magnitude more layers of tracks. In this regard, a layer of tracks may be defined as being a series of tracks that extend in the same x-y surface. Thus, the example shown in FIGS. 3 and 4 comprises 2 layers of tracks, with each layer comprising 3 tracks 252.

A rigid electrical raft 200 may be manufactured using any suitable method. For example, the rigid material 220 may initially be provided as layers of flexible material, such as (by way of example only) layers of fibre and resin compound. This flexible material may be placed into a mould, for example having a desired shape. Other components (such as fluid pipes 210 and/or the electrical conductors 252 and/or the electrical heating elements 410, which may be embedded in a FPC 250) may also be placed into the mould, for example between layers of the flexible material from which the rigid material 220 is ultimately formed. Parts of the mould may have any suitable form and/or construction, for example that could be readily removed when the electrical raft 200 is formed into the desired shape.

Figure 5:
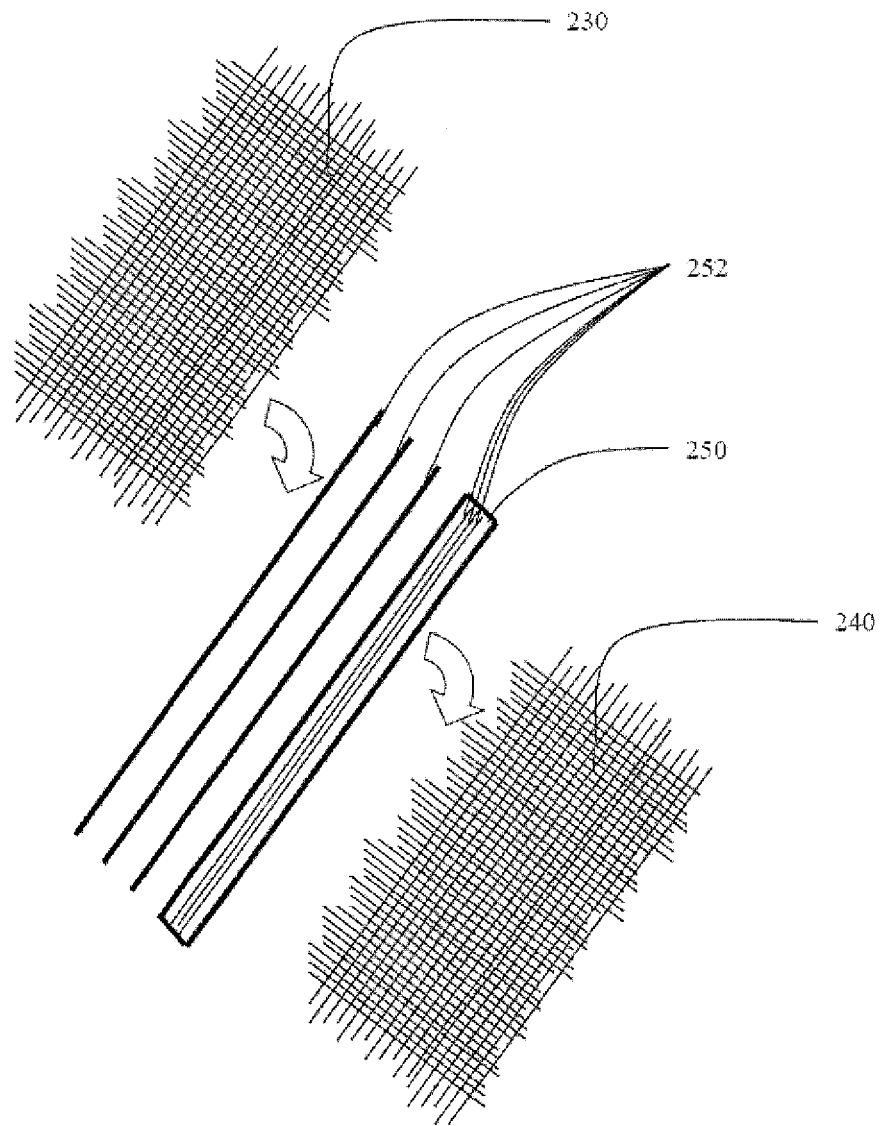
FIG. 5 shows a schematic of an electrical raft prior to assembly.

FIG. 5 shows components of an example of an electrical raft 200 prior to one method of construction. The electrical conductors 252 are provided between two layers of material 230, 240 that, after construction, form the rigid material 220. No electrical heating elements 410 are shown in FIG. 5, but it will be appreciated that such electrical heating elements could also be provided in an appropriate position between layers of the material 230, 240.

Some of the electrical conductors 252 are provided in an FPC 250. The material 230, 240 may be a fibre and resin compound, as described elsewhere herein. Such a fibre and resin compound may, after suitable treatment (for example heat treatment), produce the rigid composite material 220. In the example of FIG. 5, the fibre and resin compound is formed of a sheet of interwoven fibres, or strands. The strands in FIG. 5 extend in perpendicular directions, although the strands may extend in any one or more directions as required. The strands/fibres may be pre-impregnated (or "pre-pregged") with the resin.

Prior to any treatment, both the first and second layers 230, 240 and the electrical conductors 252 may be flexible, for example supple, pliable or malleable. As such, when the layers 230, 240 and the electrical conductors 252 are placed together, they may be moulded, or formed, into any desired shape. For example, the layers 230, 240 and the electrical conductors 252 may be placed into a mould (which may be of any suitable form, such as a glass or an aluminium mould) having the desired shape. The desired shape may be, for example, a shape that corresponds to (for example is offset from) a part of a gas turbine engine, such as, by way of example only, at least a part of a casing, such as an engine fan casing or engine core casing. This may enable the final raft to adopt shapes that are curved in two-dimensions or three-dimensions.

Any suitable method could be used to produce the electrical raft 200. For example, the strands/fibres need not be pre-impregnated with the resin. Instead, the fibres/strands could be put into position (for example relative to electrical conductors 252/FPC 250) in a dry state, and then the resin could be fed (or pumped) into the mould. Such a process may be referred to as a resin transfer method. In some constructions no fibre may be used at all in the rigid material 220.

Figure 6:
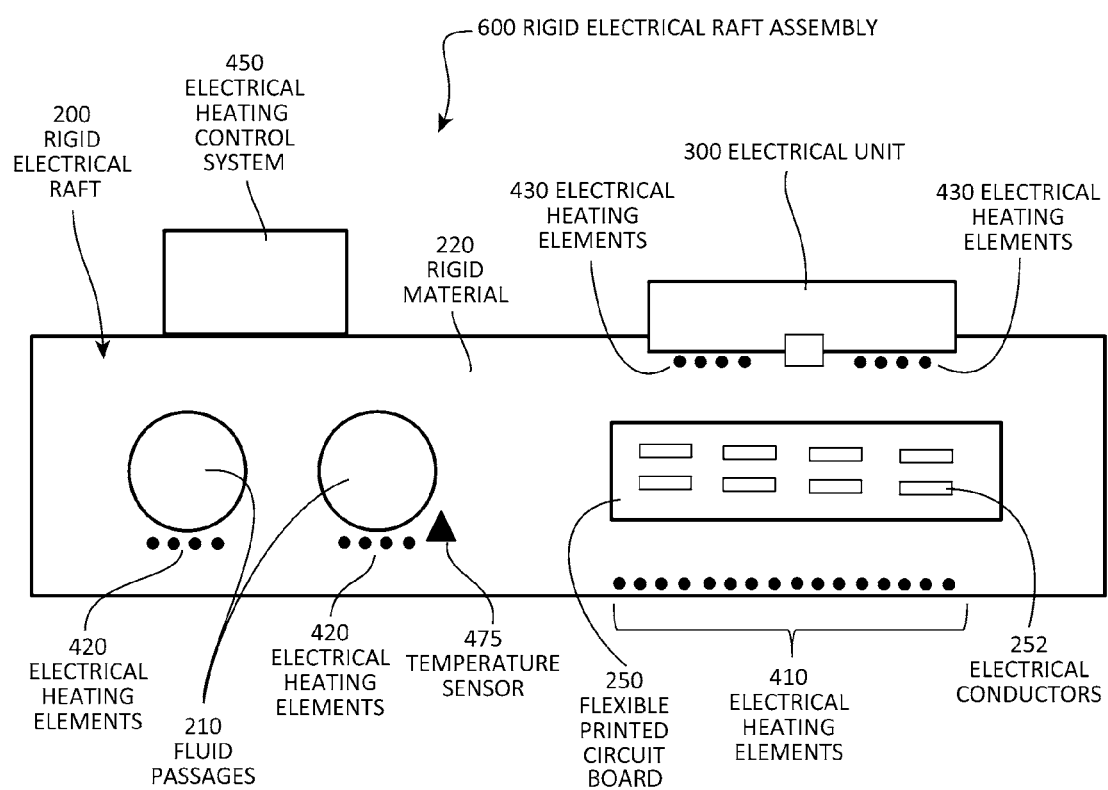
FIG. 6 shows a detailed schematic cross section through a rigid electrical raft assembly according to an example of the present invention.

FIG. 6 shows a cross section through a rigid electrical raft 200 according to an example of the invention. The rigid electrical raft 200 shown in the FIG. 6 example is a part of a rigid electrical raft assembly 600, that also comprises an electrical unit 300 mounted thereon.

The rigid electrical raft 200 comprises electrical conductors 252. The electrical conductors 252 are provided as part of a FPC 250, which is itself embedded in a rigid material 220.

The rigid electrical raft 200 also comprises embedded electrical heating elements 410, 420, 430. The electrical heating elements 410, 420, 430 are given different reference numerals in FIG. 6 depending on their physical location. However, it will be appreciated that the function and/or construction of the electrical heating elements 410, 420, 430 may be substantially the same. Alternatively or additionally, the electrical heating elements 410, 420, 430 may be different from each other (for example in terms of dimensions and/or material), for example depending on the heating power required at a given location.

A set of electrical heating elements 410 may be provided at or near to a surface of the rigid electrical raft 200, as in the FIG. 6 example. The electrical heating elements 410 may be provided to heat a surface of the electrical raft 200 so as to prevent ice and/or condensation build-up on the surface. Thus, the electrical heating elements 410 may be part of an anti-icing and/or an anti-condensation arrangement.

A set of electrical heating elements 420 may be provided at or near to fluid passages 210, such as embedded fluid passages 210 as shown in the FIG. 6 example. The electrical heating elements 420 may be arranged to prevent ice and/or condensation build-up in the fluid passages 210. Additionally or alternatively, the heating elements 420 may be provided to raise the temperature of fluid within the fluid passages 210 to a desired level.

A set of electrical heating elements 430 may be provided at or near to an electrical unit 300 the may be mounted on the rigid electrical raft 200. The electrical unit 300 may be physically and/or electrically mounted to the rigid electrical raft 200. The electrical heating elements 430 may provide heating to the electrical unit 300 to keep the temperature within a desired range. Note that the electrical heating elements 430 may allow electrical components (including electrical units 300 and other electrical components) to be provided in location that would otherwise be unsuitable due to low and/or unstable temperatures.

The rigid electrical raft 200 shown in FIG. 6 is provided with an electrical heating control system 450. Although the electrical heating control system 450 is shown as being mounted on a surface of the rigid electrical raft 200 in FIG. 6, it could be provided in any suitable location, which may be remote from the rigid electrical raft 200. The electrical heating control system 450 may provide electrical signals and/or electrical power to the electrical heating elements 410, 420, 430 so as to control the amount of heat provided by the electrical heating elements 410, 420, 430.

The rigid electrical raft 200 shown in FIG. 6 also comprises a temperature sensor 475. A temperature sensor 475 may be positioned as desired in order to monitor the temperature at a desired location, for example in the rigid electrical raft 200. The temperature sensor 475 in FIG. 6 is shown in the region of the embedded fluid passages 210 by way of example.

The temperature sensor 475 may provided temperature information to the electrical heating control system 450, and indeed may be considered to be a part of the electrical heating control system 450.

It will be appreciated that many of the components shown in the FIG. 6 example may be electrically connected together, but the electrical connections are not shown in FIG. 6 for clarity. However, FIG. 2 does show one such connection. Purely by way of example, the electrical conductors 252 and the electrical heating elements 410, 420, 430 may be electrically connected together, for example so that the electrical conductors can provide electrical power to the electrical heating elements (e.g., FIG. 2 shows an electrical conductor 252 electrically connected to an electrical heating element 410). By way of further example, the electrical control system 450 may be electrically connected to any one or more of the electrical heating elements 410, 420, 430, the electrical conductors 252 and the temperature sensor 475 so that electrical power and/or signals can be communicated therebetween.

Figure 7:
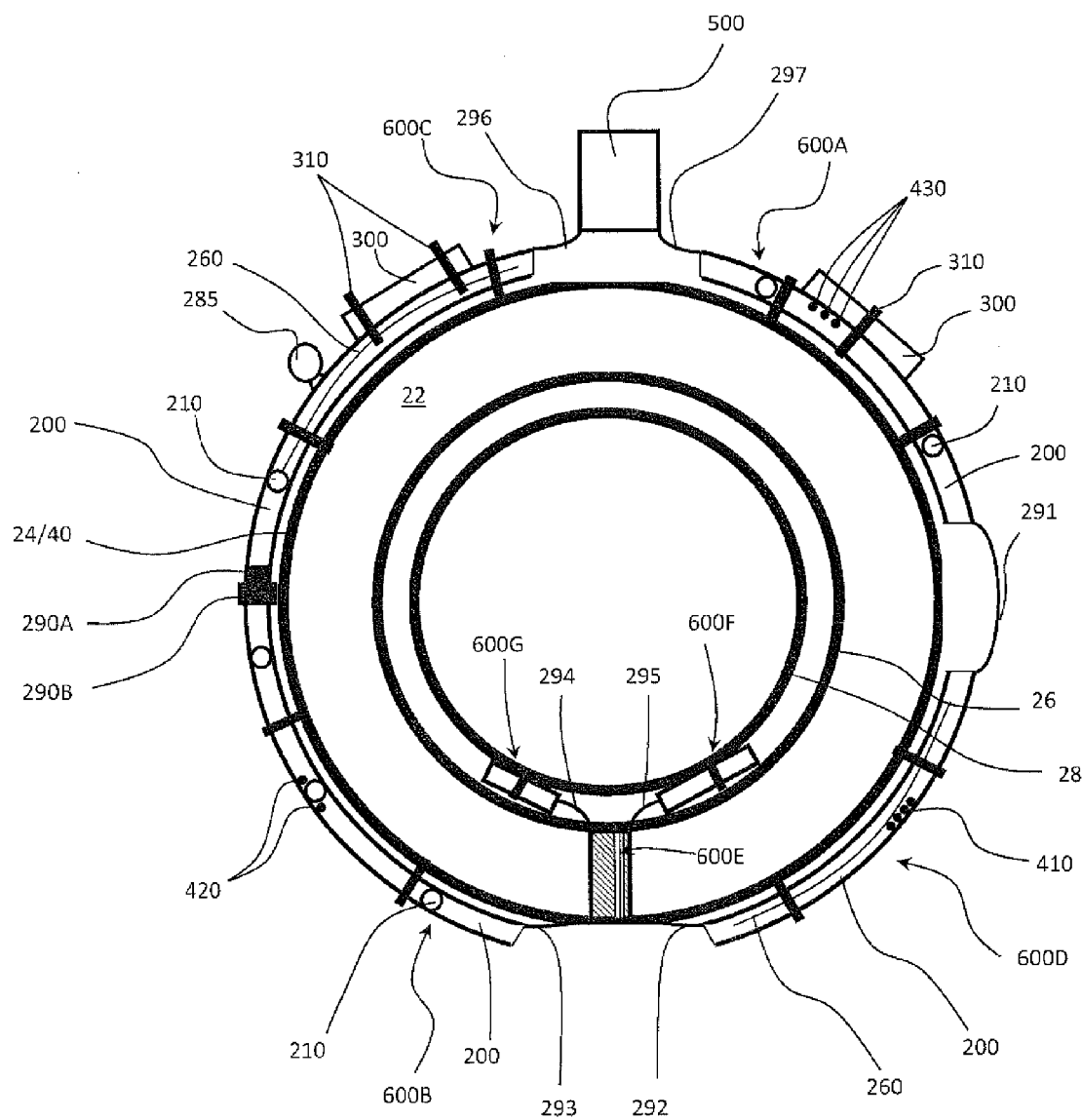
FIG. 7 shows a cross-section normal to the axial direction through a gas turbine engine having rigid electrical rafts in accordance with the present invention.

FIG. 7 is a schematic showing a cross-section perpendicular to the direction X-X of a gas turbine engine comprising electrical raft assemblies 600A-600G. Any one of the electrical raft assemblies 600A-600G may comprise any or all of the features of a rigid electrical raft 200 or a rigid electrical raft assembly 600 as described above, for example. Thus, for example, any one of the electrical raft assemblies may comprise an electrical raft 200 (not labelled for raft assemblies 600E-600G for simplicity only) having electrical conductors 252 (not labelled in FIG. 7 for simplicity only) and electrical heating elements 410, 420, and/or 430 embedded therein. The electrical heating elements 410, 420, 430 can be controlled via the engine electronic controller or aircraft systems, and can be automatic or require pilot action.

Thus, at least one of the electrical raft assemblies 600 shown in FIG. 7 is provided with electrical conductors 252 and electrical heating elements 410, 420, 430 embedded therein. Purely by way of example only, electrical heating elements 410, 420, 430 are shown in three of the electrical raft assemblies (600A, 600B, 600D), but the electrical heating elements 410, 420, 430 could be provided to more or fewer electrical raft assemblies 600.

Some or all of the electrical raft assemblies 600A-600G (which may collectively be referred to as electrical raft assemblies 600) comprise a mounting fixture for attaching the respective assembly 600 to a mounting structure. The mounting structure is part of a fan case 24 for electrical raft assemblies 600A-600D, part of a bifurcation splitter that radially crosses a bypass duct 22 for electrical raft assemblies 600E and part of an engine core case 28 for electrical raft assemblies 600F and 600G. However, it will be appreciated that an electrical raft assembly 600 could be mounted in any suitable and/or desired location on a gas turbine engine.

In FIG. 7, two electrical raft assemblies 600A, 600C are shown as having an electrical unit 300 mounted on the respective electrical raft 200. However, any (or none) of the electrical raft assemblies 600A-600G may have an electrical unit 300 mounted to the respective electrical raft 200 and optionally may have electrical heating elements 430 associated therewith (as in the electrical raft 200 of the electrical raft assembly 600A).

As mentioned herein, each of the electrical rafts 200 associated with the electrical raft assemblies 600A-600G shown in FIG. 7 comprises one or more electrical conductors 252 embedded therein. However, any one or more of the electrical rafts 200 may be replaced with a raft that does not comprise electrical conductors 252. Such a raft would not be a rigid electrical raft 200, but may otherwise be as described elsewhere herein, for example it may be a rigid raft that may have components/systems (such as, by way of example only, fluid systems, such as pipes) mounted thereon and/or embedded therein and/or an integral tank formed in the rigid material. Thus, for example, a gas turbine engine in accordance with the present invention may have a combination of electrical rafts 200 and non-electrical rafts.

An electrical raft 200 may comprise an electrically conductive grounding or screen layer 260, as shown in the electrical rafts 200 associated with the electrical raft assemblies 600C, 600D shown in FIG. 7. However, it will be appreciated that electrical rafts 200 according to the invention and/or for use with the invention need not have such an electrically conductive grounding or screen layer 260. Where an electrically conductive grounding or screen layer 260 is present, an electrically conductive fastener 310 may be used to fasten, or fix, the electrical unit 300 (where present) to the electrical raft 200. This may allow the electrical unit 300 to be electrically grounded. It will also be appreciated, however, that electrical rafts 200 according to the invention and/or for use with the invention need not have such an electrically conductive fastener 310.

The arrangement of electrical raft assemblies 600A-600G shown in FIG. 7 is by way of example only. Alternative arrangements, for example in terms of number, size, shape and/or positioning, of electrical raft assemblies 600A-600G may be used. For example, there need not be seven electrical raft assemblies, the assemblies may or may not be connected together, and the rafts could be provided to (for example mounted on) any one or more components of the gas turbine engine. Purely by way of example only, connection between electrical raft assemblies 600A-600D mounted on the fan casing 24 to the electrical raft assemblies 600F, 600G mounted on the core casing 28 may be provided at least in part by means other than an additional electrical raft assembly 600E, for example using wire conductors with insulating sleeves. By way of further example, one or more electrical raft assemblies 600 may additionally or alternatively be provided to the nose cone, structural frames or elements within the engine (such as "A-frames"), the nacelle, the fan cowl doors, and/or any connector or mount between the gas turbine engine 10 and a connected structure (which may be at least a part of a structure in which the gas turbine engine 10 is installed), such as the pylon 500 between the gas turbine engine 10 and an airframe (not shown).

Any one or more of the electrical rafts of the electrical raft assemblies 600A-6000 may have a fluid passage 210 embedded therein and/or provided thereto, as mentioned elsewhere herein. One or more fluid passage 210 may have embedded electrical heating elements 420 associated therewith, so as to provide heating thereto as desired. The fluid passage 210 may be part of a fluid system, such as a gas (for example pneumatic or cooling gas/air) and/or liquid (for example a fuel, hydraulic and/or lubricant liquid). In the FIG. 7 example, three of the electrical rafts (of electrical raft assemblies 600A, 600B, 600C) comprise a fluid passage 210 at least partially embedded therein. The electrical raft of assembly 600C also has a fluid passage 285 (which may be for any fluid, such as those listed above in relation to embedded passage 210) mounted thereon. Such a mounted fluid passage 285 may be provided to any electrical raft, such as those of electrical raft assemblies 600A-600G shown in FIG. 7. The fluid passages 210, 285 shown in FIG. 7 may be oriented in an axial direction of the engine 10. However, fluid passages may be oriented in any direction, for example axial, radial, circumferential or a combination thereof. Any of the fluid passages may be in fluid communication with a tank that may be integral with the respective raft 200. Such a fluid tank may be formed from a rigid electrical raft 200, which may have electrical heating elements 410, 420, 430 embedded therein.

Any of the electrical raft assemblies 600A-600G (or the respective electrical rafts 200 thereof) may have any combination of mechanical, electrical and/or fluid connections to one or more (for example 2, 3, 4, 5 or more than 5) other components/systems of the gas turbine engine 10 and/or the rest of the gas turbine engine 10. Examples of such connections are shown in FIG. 7, and described below, but other connectors may be used. For example, electrical raft assemblies 600 (and/or non-electrical rafts) may be connected together (or to other components) using any combination of electrical, fluid and/or mechanical connectors. Thus, any of the connections 290A/290B, 291-297 shown in FIG. 7 may be any combination of electrical, fluid and/or mechanical connection. Alternatively, electrical raft assemblies 600 (and/or non-electrical rafts) may be standalone, and thus may have no connection to other rafts or components.

A connection 291 is shown between the electrical rafts of the assemblies 600A and 600D. The connection 291 may comprise an electrical connection. Such an electrical connection may be flexible and may, for example, take the form of a flexible printed circuit such as the flexible printed circuit 250 shown in FIGS. 3 and 4. Such a flexible electrical connection may be used to electrically connect any electrical raft assembly 600 to any other component, such as another electrical raft assembly 600. A connection 297 (which may be or comprise an electrical connection) is provided between the electrical raft of the assembly 600A and a part of an airframe, or airframe installation 500, which may, for example, be a pylon. Similarly, a fluid and/or mechanical connection 296 may additionally or alternatively be provided between the airframe 500 and another electrical raft of the assembly 600C. As shown in FIG. 7, other electrical and/or fluid connections 292, 293, 294, 295 may be provided between electrical rafts 200 (or assemblies 600) and other components, such as other electrical rafts 200 (or assemblies 600).

A direct connection 290A, 290B may be provided, as shown for example between the electrical rafts of the assemblies 600B and 600C in the FIG. 7 arrangement. Such a direct connection 290A, 290B may comprise a connector 290A provided on (for example embedded in) one electrical raft 200 connected to a complimentary connector 290B provided on (for example embedded in) another electrical raft 200. Such a direct connection 290A, 290B may, for example, provide fluid and/or electrical connection between the two electrical rafts assemblies 600B, 600C.

Figure 8:
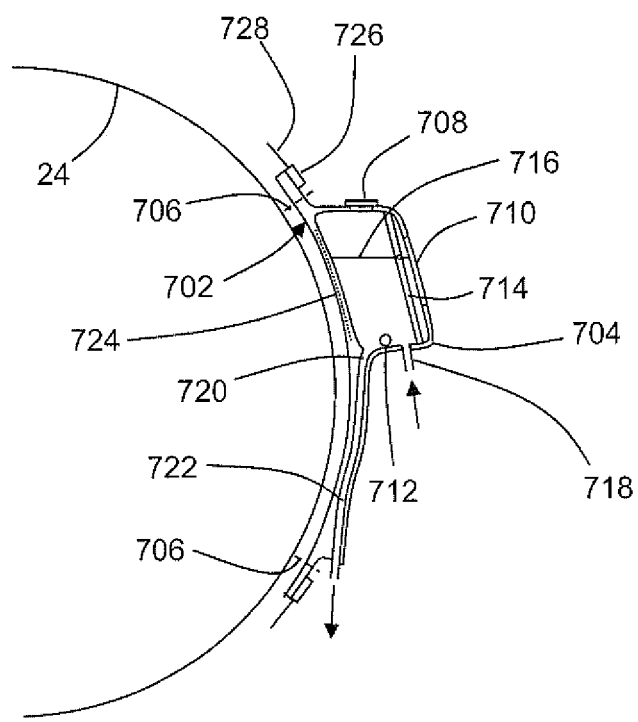
FIG. 8 shows schematically a cross-sectional view of an embodiment of a rigid electrical raft in accordance with the present invention, the raft having a tank for containing engine oil integrally formed therewith.

Although not shown in FIG. 7, an engine (such as a gas turbine engine) may comprise a rigid raft (for example a rigid electrical raft 200) formed into at least a part (for example all) of an integral tank 704, as shown in FIG. 8.

Such an integral tank 704 may be formed by using a suitably shaped mould, for example using the process explained above in relation to FIG. 5.

FIG. 8 shows schematically a cross-sectional view of an embodiment of a rigid electrical raft 702 in accordance with the present invention. The rigid electrical raft 702 may be as described elsewhere herein in relation to the rigid electrical rafts 200 other than in its shape. The raft is mounted to the fan case 24 of the engine by raft location formations 706 and has an integral tank 704 for containing an engine fluid, such as engine oil or fuel. Advantageously, the tank does not require separate location formations for mounting to the engine. Also, the weight, cost, reliability and robustness of the tank can be improved compared with conventional, stand-alone tanks.

The raft may have the position, structure and features of any one of the rafts or raft assemblies described above in relation to FIGS. 2 to 7. The raft 702 in the FIG. 8 example includes an electrical system comprising electrical conductors (not shown) embedded in the plastic matrix composite material of the raft. Electrical connectors 726 and flexible cables 728, connect the electrical conductors to other components of the engine.

The oil tank has a composite body like the rest of the raft, and can be created by making a chamber within the raft during moulding or laying up of the raft.

The raft 702 in the example of FIG. 8 has a metal liner, which helps to prevent leakage from the tank and provides increased strength and robustness.

The tank 704 has a filler cap 708 which includes a pressure relief valve, and a sight glass 710. It also has a thermocouple-based oil temperature sensor 712 and a quantity sensor 714 for measuring the oil level 716 in the tank. The leads for these sensors can be embedded in the raft and integrated with the electrical system of the raft, reducing their susceptibility to accidental and vibration-induced damage.

The tank 704 forms a protrusion on the outer side of the raft 702. An inlet port 718 to the tank is formed at the outer side of the base of the tank, and an outlet port 720 from the tank is formed at the inner side of the base of the tank. The outlet port feeds a flow passage 722 which extends through the raft. A FCOC or AOHE heat exchanger (not shown) can be located beneath the tank to cool the oil entering the tank through the inlet port.

Other features such as electronic magnetic chip detectors, oil filters, and pressure sensors can be incorporated into the raft 702, but are not shown in FIG. 8.

The raft shown in FIG. 8 also includes electrical heating elements 724 which are embedded in the raft 702 at the inner wall of the tank 704. The electrical heating elements 724 may be as described elsewhere herein with reference to the electrical heating elements 410, 420, 430. In this way, fluid in the tank 704 can be heated to a desired temperature. For example, if the tank 704 contains oil, it can be de-congealed, for example in cold weather, using electrical power from a ground cart or auxiliary power unit before engine start-up. After heating the oil to a sufficiently high temperature, the engine can be started, and because the oil pump draws oil from the tank and pumps it around the system, the de-congeal time for the entire oil system can be significantly reduced, lowering the risk of damage that may occur to engine parts through operation with congealed oil.

The electrical heating elements 724 can operate using electrical resistance and current to generate heat, as with the other electrical heating elements 410, 420, 430 described herein. They can line one side of the tank as illustrated in FIG. 8, or more than one side. The heating elements can be controlled via the engine electronic control or aircraft systems, and can be automatic or require pilot action. Power leads for the heating element can be embedded in the raft and integrated with the electrical system of the raft.

It will be appreciated that many alternative configurations and/or arrangements of rigid electrical rafts 200 and rigid electrical raft assemblies 600 and gas turbine engines 10 comprising rigid electrical rafts 200 and rigid electrical raft assemblies 600 other than those described herein may fall within the scope of the invention. For example, alternative arrangements of electrical raft assemblies 600 (for example in terms of the arrangement, including number/shape/positioning/constructions, of mounting fixtures, the arrangement/shape/positioning/construction of the electrical rafts 200, the type and/or positioning of components (if any) mounted to/embedded in the electrical rafts 200, the rigid material 220, the electrical conductors 252 and the electrical heating elements 410, 420, 430) may fall within the scope of the invention and may be readily apparent to the skilled person from the disclosure provided herein. Alternative arrangements of connections (for example mechanical, electrical and/or fluid) between the electrical (or non-electrical) rafts and/or raft assemblies and between the electrical (or non-electrical) rafts or raft assemblies and other components may fall within the scope of the invention and may be readily apparent to the skilled person from the disclosure provided herein. Furthermore, any feature described and/or claimed herein may be combined with any other compatible feature described in relation to the same or another embodiment.

Where reference is made herein to a gas turbine engine, it will be appreciated that this term may include a gas turbine engine/gas turbine engine installation and optionally any peripheral components to which the gas turbine engine may be connected to or interact with and/or any connections/interfaces with surrounding components, which may include, for example, an airframe and/or components thereof. Such connections with an airframe, which are encompassed by the term "gas turbine engine" as used herein, include, but are not limited to, pylons and mountings and their respective connections. The gas turbine engine itself may be any type of gas turbine engine, including, but not limited to, a turbofan (bypass) gas turbine engine, turbojet, turboprop, ramjet, scramjet or open rotor gas turbine engine, and for any application, for example aircraft, industrial, and marine application. Raft assemblies such as any of those described and/or claimed herein may be used as part of any apparatus, such as any vehicle, including land, sea, air and space vehicles, such as motor vehicles (including cars and busses), trains, boats, submarines, aircraft (including aeroplanes and helicopters) and spacecraft (including satellites and launch vehicles).

While the invention has been described in conjunction with the exemplary embodiments described above, many equivalent modifications and variations will be apparent to those skilled in the art when given this disclosure. Accordingly, the exemplary embodiments of the invention set forth above are considered to be illustrative and not limiting. Various changes to the described embodiments may be made without departing from the scope of the invention.

We claim:

1. A gas turbine engine comprising:
an electrical harness arranged to transmit electrical signals around the gas turbine engine, wherein the electrical harness comprises a rigid electrical raft that is mounted directly to the gas turbine engine, and the rigid electrical raft comprises:

electrical conductors embedded in a material so as to be surrounded and contacted by, and thereby fixed in position by, the material over their entire length, at least some of the electrical conductors being arranged to transmit the electrical signals; and electrical heating elements embedded in the material so as to be surrounded and contacted by, and thereby fixed in position by, the material, the electrical conductors and the electrical heating elements being spaced apart, and the electrical heating elements being arranged to provide electrical heating, wherein a cross-sectional area of the electrical heating elements is smaller than a cross-sectional area of the electrical conductors, and/or the electrical heating elements are constructed from a higher resistance material than the electrical conductors.

2. A gas turbine engine according to claim 1, further comprising
a temperature sensor arranged to measure a temperature at a specific region of the rigid electrical raft.

3. A gas turbine engine according to claim 1, further comprising
a fluid passage embedded in the material, wherein at least one of the electrical heating elements is positioned so as to provide heat to the fluid passage.

4. A gas turbine engine according to claim 1, wherein the material is a rigid composite material.

5. A gas turbine engine according to claim 1, wherein the electrical heating elements are provided as electrical wires and/or flexible printed circuits.

6. A gas turbine engine according to claim 1, wherein the electrical conductors are provided as electrical wires and/or flexible printed circuits.

7. A gas turbine engine according to claim 1, wherein at least some of the electrical heating elements are electrically connected to the electrical conductors, such that electrical power is supplied to the electrical heating elements by the electrical conductors.

8. A gas turbine engine according to claim 1, wherein the rigid electrical raft is part of an anti-icing system, and the electrical heating elements are constructed and arranged to prevent ice build-up on at least a part of the rigid electrical raft.

9. A gas turbine engine according to claim 1, wherein the rigid electrical raft is part of an anti-condensation system, and the electrical heating elements are constructed and arranged to prevent condensation build-up on at least a part of the rigid electrical raft.

10. A gas turbine engine according to claim 1, wherein the rigid electrical raft is part of a fluid tank, and
the electrical heating elements are constructed and arranged so as to provide, in use, heating to fluid contained in the fluid tank.

11. A gas turbine engine according to claim 1, wherein the rigid electrical raft is part of a rigid electrical raft assembly, the rigid electrical raft assembly further comprising an electrical component mounted to the rigid electrical raft, and
the electrical heating elements are constructed and arranged to heat the electrical component such that it is maintained at a desired temperature, or within a range of desired temperatures.

* * * * *